United States Patent

Matsushita et al.

[11] Patent Number: 6,049,340
[45] Date of Patent: Apr. 11, 2000

[54] CAD SYSTEM

[75] Inventors: Takeshi Matsushita, Kawasaki; Hiroshi Ichimura, Nagano; Yukio Hirayama, Kawasaki; Chizuru Shomura, Nagano, all of Japan

[73] Assignee: Fujitsu Limited, Kawasaki, Japan

[21] Appl. No.: 08/744,985

[22] Filed: Nov. 7, 1996

[30] Foreign Application Priority Data

Mar. 1, 1996 [JP] Japan .................................... 8-044382

[51] Int. Cl.[7] .................................................. G06F 15/00
[52] U.S. Cl. ............................................................ 345/441
[58] Field of Search .................................... 345/440, 441, 345/433, 438, 117, 118

[56] References Cited

U.S. PATENT DOCUMENTS

| | | | |
|---|---|---|---|
| 5,197,120 | 3/1993 | Saxton et al. | 395/139 |
| 5,299,307 | 3/1994 | Young | 395/161 |
| 5,623,583 | 4/1997 | Nishino | 395/120 |

*Primary Examiner*—Phu K. Nguyen
*Attorney, Agent, or Firm*—Staas & Halsey, LLP

[57] ABSTRACT

The present invention is a computer aided design (CAD) system in which graphic drawings are generated by the user selecting and placing figures representing objects such as walls and doors on a screen. This is accomplished using a command selecting unit that selects a command for placing an object of a desired shape in a desired position. Once the command is selected a parameter managing unit is engaged. This parameter managing unit holds parameters used to execute the selected command and also displays values set for the parameters in a parameter field on a display screen. The user may also enter desired values for the parameters using a parameter entering unit. In response to a user request to execute a command, a command executing unit determines the position and shape of the object using the values set for the parameters, and places the object in the proper location of the drawing display area.

5 Claims, 15 Drawing Sheets

CAD SYSTEM

BACKGROUND OF THE INVENTION (1) Field of the Invention

The present invention relates to a CAD (computer-aided design) system for generating a graphic drawing by placing figures corresponding to objects on a display screen, and more particularly to a CAD system for generating graphic drawings of buildings or the like.

(2) Description of the Related Art

CAD systems for use generating graphic drawings of buildings handle columns, walls, fittings, etc. as objects, and generate graphic drawings of buildings by placing figures representing those objects in desired positions on a display screen. It is a general practice to indicate the positions where the figures are to be placed with a pointing device such as a mouse or the like.

For placing a figure on the display screen, it may occasionally be necessary to establish detailed settings. For example, such detailed setting are required when a wall is to be positioned between columns so that surfaces of the wall and the columns lie flush with each other. To position the wall between the columns on the display screen, sides of figures representing the columns and a side of a figure representing the wall have to be aligned with each other. According to one simple process, a desired position for the wall may be indicated by a pointing device such as a mouse through fine adjustment of the pointing device. This process, however, is disadvantageous in that it is difficult for the user to control the pointing device for fine adjustment, and it is time-consuming to indicate the desired position.

Some conventional CAD systems are capable of indicating a desired position of a figure by entering a command from a keyboard in a command entry mode. When a wall surface distance for a figure is established by entering a numerical value, the position where the figure is to be placed deviates from a reference point depending on the established wall surface distance. By setting a suitable value to the wall surface distance, it is possible to bring the position where the figure is to be placed into a desired position. Therefore, sides of figures representing the columns and a side of a figure representing the wall can be aligned with each other by setting a suitable value to a wall surface distance.

For generating a graphic drawing for a building, it is necessary to follow certain layout rules which are peculiar to the building drawings. For example, a fitting has to be placed on a wall or the like. Consequently, designers who produce design drawings for buildings are required to indicate positions where figures are to be placed with those layout rules in mind.

For a CAD system user to indicate various parameters including the wall surface distance from command lines, the user has to be aware of the names and meanings of various parameters. Since the names of parameters are represented by simple strings of letters, the meanings of the parameters cannot be recognized based on the names thereof. Therefore, CAD systems cannot be fully operated by users unless they have a certain level of knowledge about the parameters.

Because of the layout rules peculiar to the building drawings, CAD system users must always understand what objects are represented by the figures displayed on the display screen and how they are related to an object which is going to be added. Furthermore, certain objects need their shapes to be established in addition to their positions. For example, when a door is to be placed in the graphic drawing on the display screen, it is necessary to establish the direction in which the door can be opened in addition to the position where the door is to be placed. As a result, the conventional CAD systems for generating graphic drawings for buildings have posed an excessive burden on building designers who use those CAD systems to generate building design drawings.

SUMMARY OF THE INVENTION

It is therefore an object of the present invention to provide a CAD system which allows the user to establish various settings for the shapes and positions of objects with ease.

To achieve the above object, there is provided in accordance with the present invention a CAD system for generating a graphic drawing by placing a figure on a display screen of a display device, comprising command selecting unit for selecting a command to place a figure of a desired shape in a desired position, parameter managing unit for holding parameters used to execute the command which is selected, and displaying values set for the parameters on the display screen, parameter entering unit for entering given values for the parameters which are held by the parameter managing unit, and command executing means for determining the position and shape of the figure using the values set to the parameters in response to an instruction to execute the command.

According to the present invention, there is also provided a CAD system for generating a graphic drawing by placing a figure on a display screen, comprising command selecting unit for selecting a command to place a figure of a desired shape in a desired position, cursor moving unit for moving a cursor on the display screen, related figure detecting unit for detecting, among determined figures that have already been is displayed on the display screen, a related figure which is positioned within a given distance from the cursor and on which the figure can be placed in superposed relation, and figure display control unit for displaying the figure on the cursor until the related figure is detected, then displaying the FIG. on the related figure when the related figure is detected, and regarding the position of the displayed figure when an instruction to execute the command is outputted, as a layout reference position for the figure.

According to the present invention, there is also provided a CAD system for generating a graphic drawing by placing a figure on a display screen, comprising command selecting unit for selecting a command to place a figure of a desired shape in a desired position, layout position determining unit for determining a layout reference position for the figure when the command is selected by the command selecting means, cursor moving unit for moving a cursor on the display screen, and figure shape control unit for varying the position or shape of the figure whose layout reference position has been determined, with respect to the layout reference position depending on the position of the cursor, and placing the figure of the shape in the position at the time an instruction to execute the command is outputted.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

Figure 1:
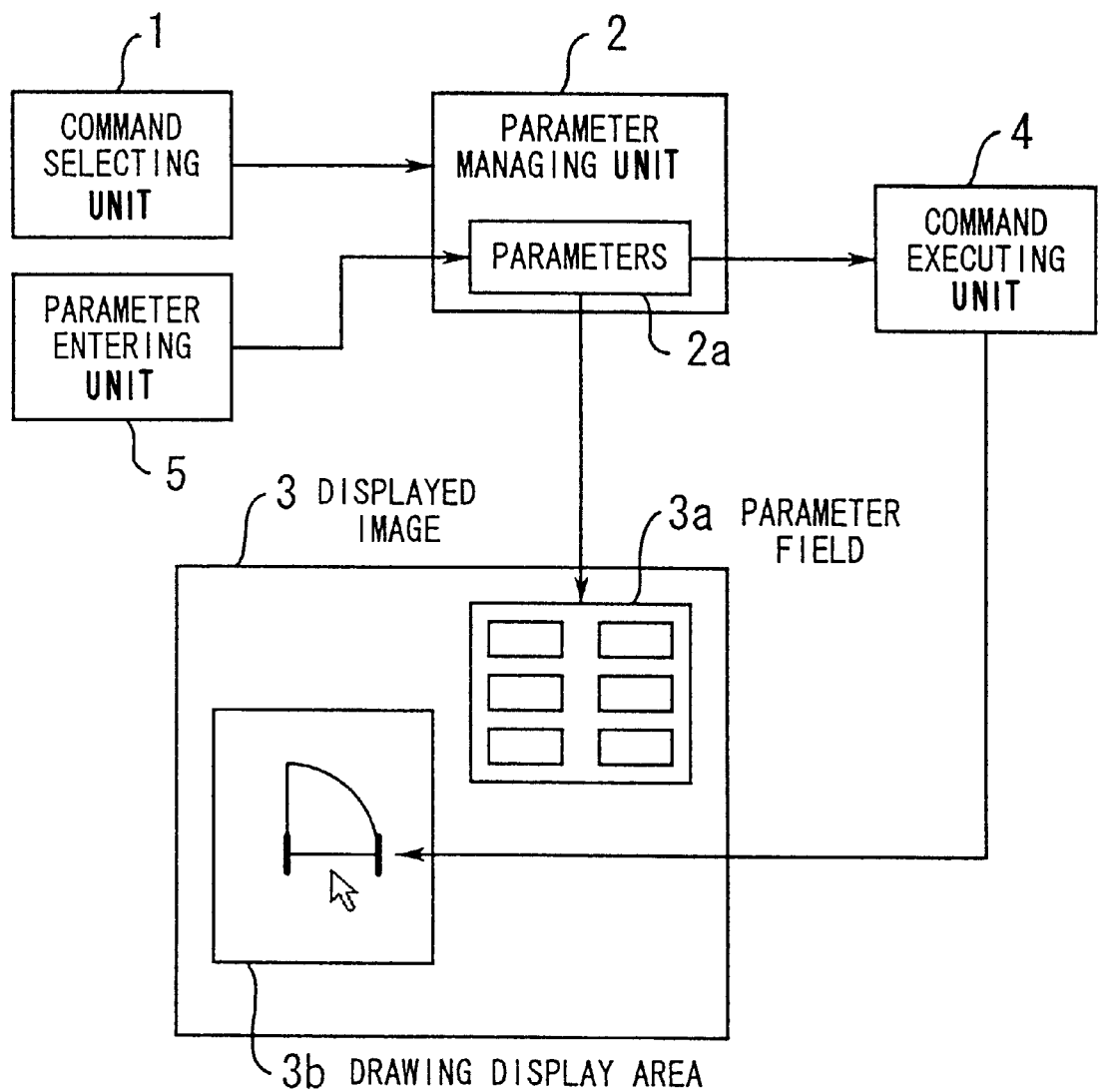
FIG. 1 is a block diagram showing the principles of the present invention for facilitating the entry of numerical values for parameters.

FIG. 1 shows in block form the principles of the present invention for facilitating the entry of numerical values for parameters.

As shown in FIG. 1, a command selecting unit 1 selects a command to place a figure at a desired position with desired shape. A parameter managing unit 2 holds parameters 2a used to execute commands that are selected, and displays values set for the parameters 2a in a parameter field 3a in a displayed image 3.

The person who generates a graphic drawing based on the principles of the present invention confirms the parameter field 3a, recognizes parameters required for a command which is selected, and enters desired values for the parameters through a parameter entering unit 5. When there is a command for executing the command, a command executing unit 4 determines the position and shape of the figure using the values set to the parameters 2a and places the figure in a drawing display area 3b in the displayed image 3.

Therefore, the person who generates a graphic drawing can properly establish required parameters even without the names and meanings of the many parameters. Such a function will hereinafter be referred to as a positioning box function.

Figure 2:
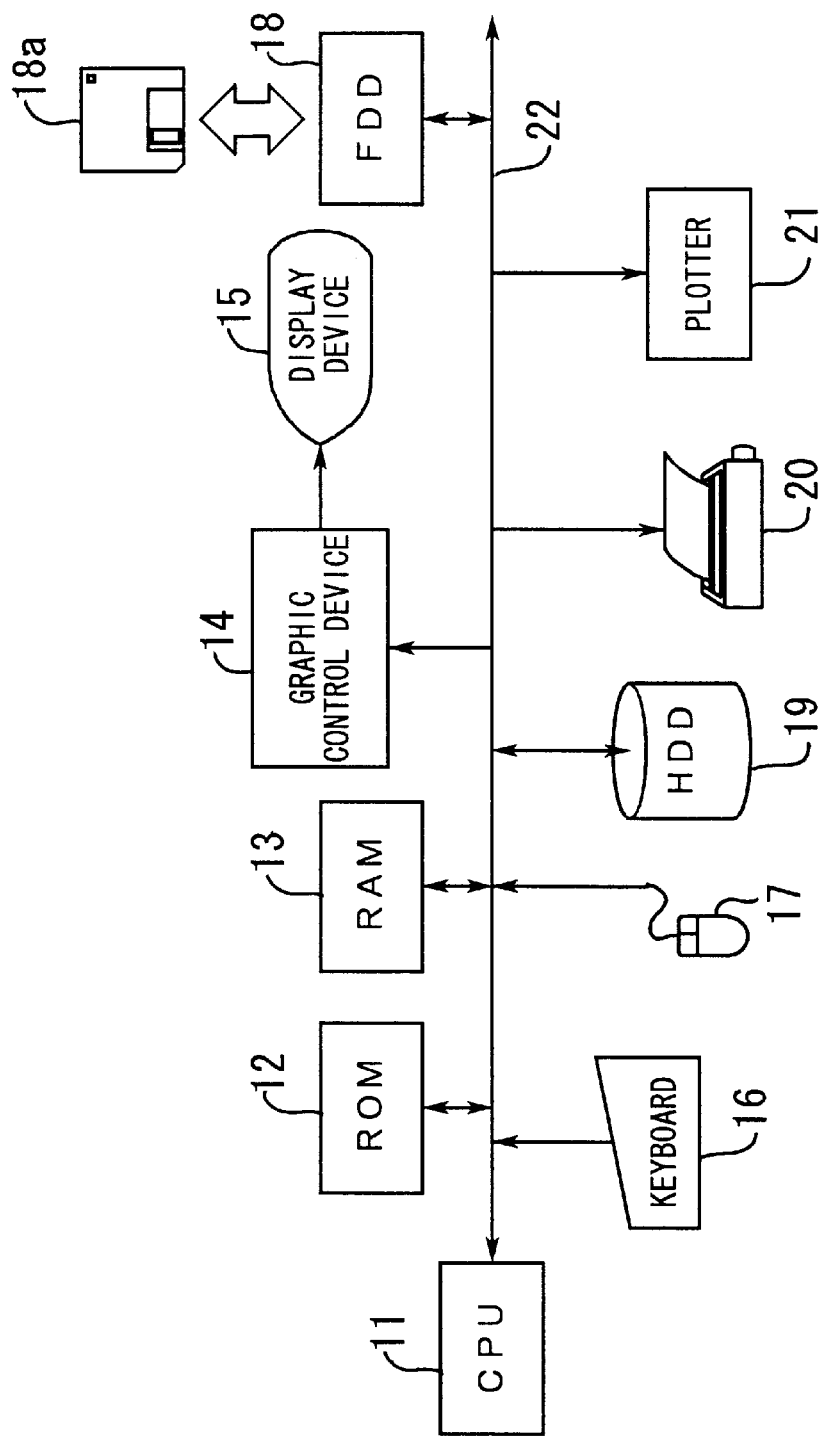
FIG. 2 is a block diagram of a hardware arrangement of a CAD system according to the present invention.

A hardware arrangement of a CAD system according to the present invention will be described below with reference to FIG. 2. In FIG. 2, the CAD system is a multiwindow CAD system and runs a CAD program which is used to generate graphic drawings of buildings.

As shown in FIG. 2, the CAD system has a central processing unit (CPU) 11 for controlling basic operation of various devices connected to a bus 22 according to a group of programs stored in a ROM (read-only memory) 12. The central processing unit 11 also processes various data according to an operating system (OS) stored in a RAM (random-access memory) 13. When the CAD system is switched on, the OS is loaded into the RAM 13. For generating a graphic drawing of a building, the CAD program is loaded into the RAM 13. The RAM 13 also stores temporary calculated data and display data in a program which is being executed.

A graphic control device 14 converts a digital signal of graphic data, character data, etc. into a raster signal for display, and sends the raster signal to a display device 15, which then displays a figure or figures, characters, etc. represented by the raster signal. The display device 15 may comprise a CRT (cathode-ray tube) or a liquid crystal display panel.

A keyboard 16 comprises numerical keys, character keys, etc. for entering parameters of objects that are defined according to the CAD program, and instructions for displaying various CAD data. A mouse 17 controls the position of a mouse cursor displayed on the display device 15 and enters various instructions at the controlled position of the mouse cursor.

A hard disk drive (HDD) 19 stores the program of the OS and the CAD program to be loaded into the RAM 13, and various data including CAD data. The CAD data are stored in a format that can be recognized by the CAD program. A floppy disk drive (FDD) 18 reads data stored in a floppy disk 18a and writes generated data into the floppy disk 18a.

A printer 20 prints a graphic drawing which has been generated using the CAD program on a sheet. A plotter 21 is used by the user to produce a graphic drawing on a sheet with a pen which is set in the plotter 21.

The positioning box function which is performed by the above hardware arrangement will be described in detail below.

Figure 3:
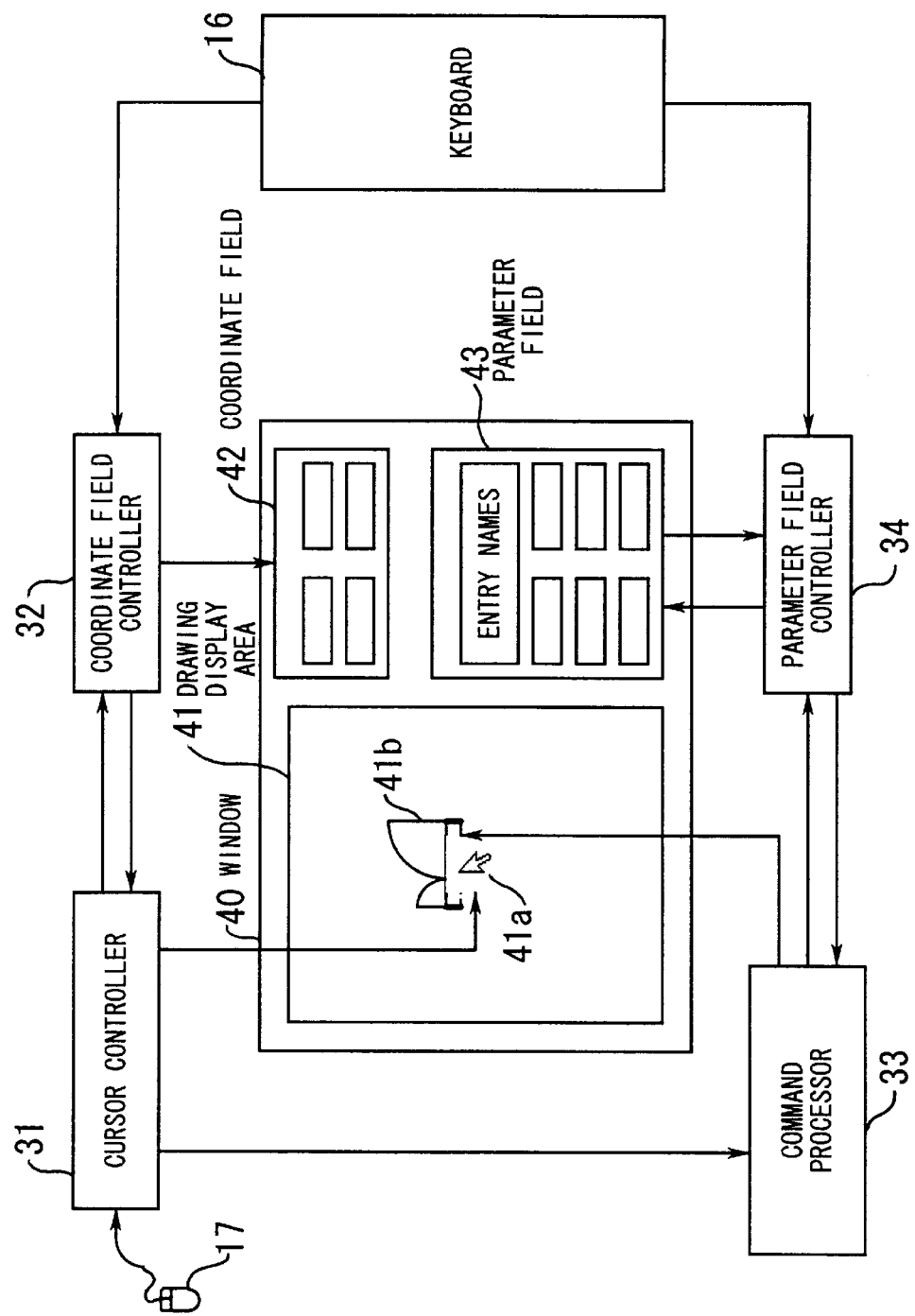
FIG. 3 is a block diagram of a positioning box function.

FIG. 3 shows the positioning box function in block form. A window 40 has a drawing display area 41 for displaying a graphic drawing which is being generated, a coordinate field 42 for displaying the coordinates of the position of a mouse cursor, and a parameter field 43 for displaying present parameters of an object which is to be controlled.

A cursor controller 31 receives an input signal from the mouse 17 and controls the position of a mouse cursor 41a in the window 40. The cursor controller 31 also indicates the present position of the mouse cursor 41a to a coordinate field controller 32. When a command is selected by the mouse 17, the cursor controller 31 sends the selected command to a command processor 33, and also indicates the present position of the mouse cursor 41a to the command processor 33. When the cursor controller 31 receives coordinate information of the mouse cursor 41a from the coordinate field controller 32, the cursor controller 31 moves the mouse cursor 41a to a position represented by the coordinate information.

The coordinate field controller 32 has therein a coordinate data storage area and a relative coordinate data storage area. When the coordinate field controller 32 receives positional information of the mouse cursor 41a from the cursor controller 31, the coordinate field controller 32 stores the received positional information as coordinate data in the coordinate data storage area, and also stores the difference (relative coordinates) between the received data and previously indicated coordinates as relative coordinate data in the relative coordinate data storage area. Furthermore, the coordinate field controller 32 displays the coordinate data and the relative coordinate data in the coordinate field 42. When coordinates in the coordinate field 42 are indicated by the keyboard 16 and a coordinate updating instruction is entered from the keyboard 16, the coordinate field controller 32 holds the indicated coordinates, updates the coordinate data with the indicated coordinates in the coordinate field 42, and transmits the updated coordinate information to the cursor controller 31.

When a selected command is given from the cursor controller 31, the command processor 33 displays a FIG. 41b represented by the command at the position of the mouse cursor 41a in the drawing display area 41. At this time, the command processor 33 delivers information of parameters required for the selected command to a parameter field controller 34. When a changed value for a parameter is received from the parameter field controller 34, the command processor 33 changes the shape of the FIG. 41b depending on the changed value. When an instruction for determining the selected command is received from the cursor controller 31, the command processor 33 executes the selected command based on the parameters which are being established at the time.

The parameter field controller 34 has a data storage area for storing parameters. When entry names for parameters necessary for the presently selected command are received from the command processor 33, the parameter field controller 34 displays the entry names in the parameter field 43. At the same time, the parameter field controller 34 acquires default values for the parameters, stores the default values in the data storage area, and displays the default values in the parameter field 43. When an instruction to update the parameters is entered from the keyboard 16, the parameter field controller 34 stores updated values in the data storage area, and displays the updated values in the parameter field 43. The parameter field controller 34 also indicates the displayed parameter values to the command processor 33. The parameter field controller 34 also has acquired information as to whether each of the parameters can be entered or not from the command processor 33. If the acquired information indicates that a parameter cannot be entered from the keyboard 16, the parameter field controller 34 rejects the entry of the parameter.

Figure 4:
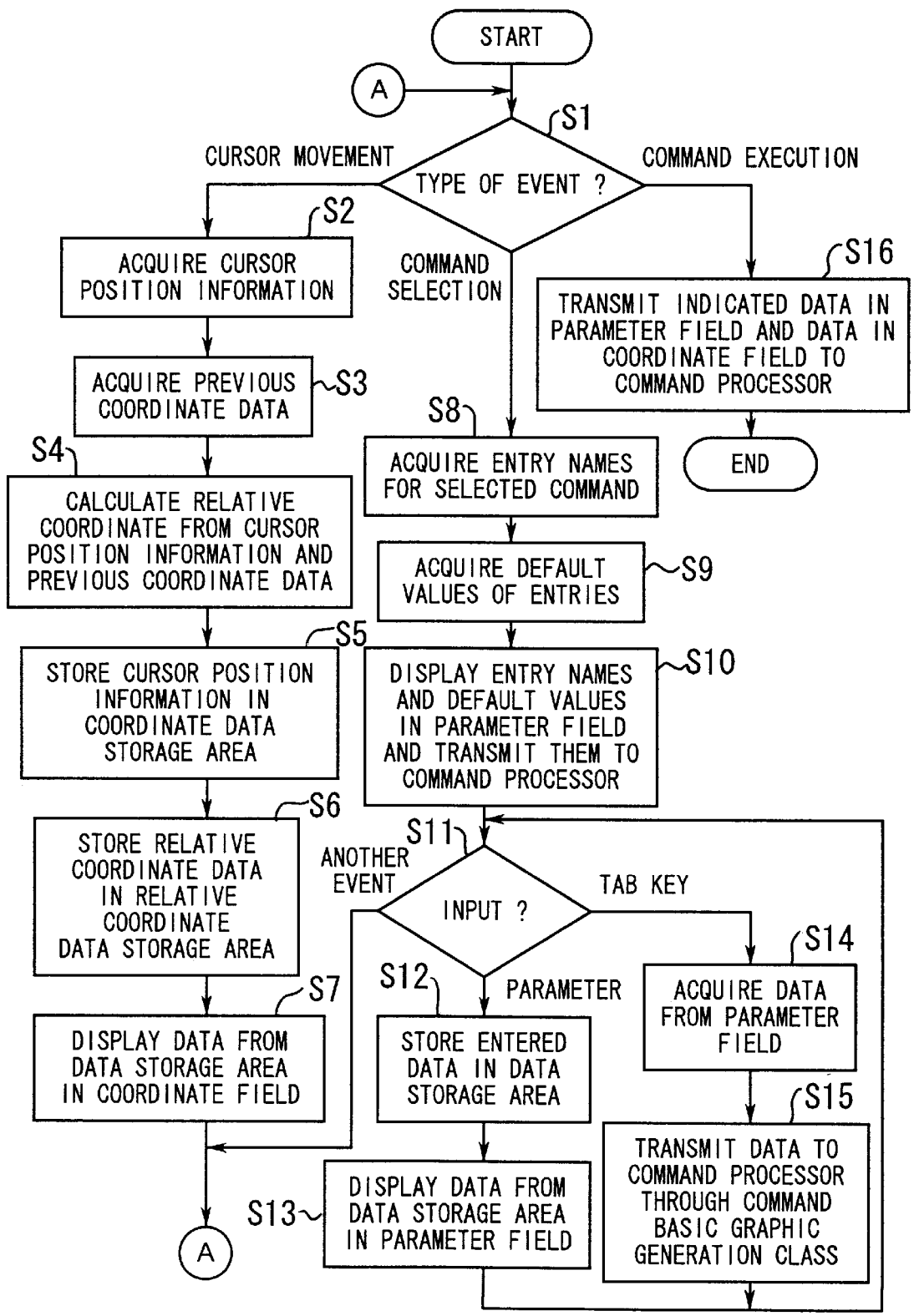
FIG. 4 is a flowchart of a processing sequence of the positioning box function.

FIG. 4 shows a processing sequence of the positioning box function. The processing sequence shown in FIG. 4 is executed by the coordinate field controller 32 and the parameter field controller 34 when an event is entered by operation of the mouse 17. The processing sequence shown in FIG. 4 will be described below.

[S1] The cursor controller 31 decides the type of an event which is entered. If the entered event is movement of the cursor, then control goes to a step S2. If the entered event is selection of a command, then control goes to a step S8. If the entered event is start of execution of a command, then control goes to a step S16.

Steps S2 through S7 given below are executed by the coordinate field controller 32 if the entered event is movement of the cursor.

[S2] The coordinate field controller 32 acquires positional information of the cursor.

[S3] The coordinate field controller 32 acquires coordinate data (previous coordinate data) at the time a previous command was executed.

[S4] The coordinate field controller 32 calculates relative coordinates from the positional information of the cursor and the previous coordinate data.

[S5] The coordinate field controller 32 stores the positional information of the cursor in the coordinate data storage area.

[S6] The coordinate field controller 32 stores the relative coordinates in the relative coordinate data storage area.

[S7] The coordinate field controller 32 displays the coordinate data from the coordinate data storage area in a "coordinate" display area in the coordinate field 42, and also displays the relative coordinate data from the relative coordinate data storage area in a "distance" display area in the coordinate field 42. Thereafter, control goes back to the step S1.

Steps S8 through S15 given below are executed by the parameter field controller 34 if the entered event is selection of a command.

[S8] The parameter field controller 34 acquires entry names for entries with respect to the selected command.

[S9] The parameter field controller 34 acquires default values for the entries from the command processor 33.

[S10] The parameter field controller 34 displays the entry names and the default values in the parameter field 43, and transmits them to the command processor 33.

[S11] The parameter field controller 34 receives entered data and determines the type of the entered data. If the entered data represent a parameter entered from the keyboard 16, then control goes to a step S12. If the entered data represent an operation from a tab key, a return key, or a shift tab key for determining a parameter, then control goes to a step S14. If the entered event is another event such as start of execution of a command or the like, then control returns to the step S1.

[S12] The parameter field controller 34 stores the entered data in the data storage area.

[S13] The parameter field controller 34 displays the data from the data storage area in the parameter field 43.

[S14] The parameter field controller 34 acquires data from the parameter field 43.

[S15] The parameter field controller 34 transmits the data in the parameter field 43 to the command processor 33 through a command basic graphic generation class. Then, control returns to the step S11. In response to the received data, the command processor 33 changes the shape of a figure which is displayed depending on the value of the parameter of the received data.

A step S16 is executed if the entered event is an event for executing a command.

[S16] The coordinate field controller 32 transmits the data in the coordinate field 42 which have been indicated, to the command processor 33, and the parameter field controller 34 transmits the data in the parameter field 34 which have been indicated, to the command processor 33. The command processor 33 executes the command based on the received data.

Therefore, when a command is selected by operating the mouse 17, entry names required to execute the command are displayed in the parameter field 43. The user of the CAD system, who generates a graphic drawing, is thus not required to memorize parameters required for the command. As a consequence, any burden imposed on the user is reduced. Since all necessary parameters are displayed in the parameter field 43, the user is prevented from making errors, e.g., forgetting to establish a parameter or overlooking a wrong value established for a parameter, and can produce a graphic drawing efficiently.

Examples of various commands which are executed will be described below.

Figure 5:
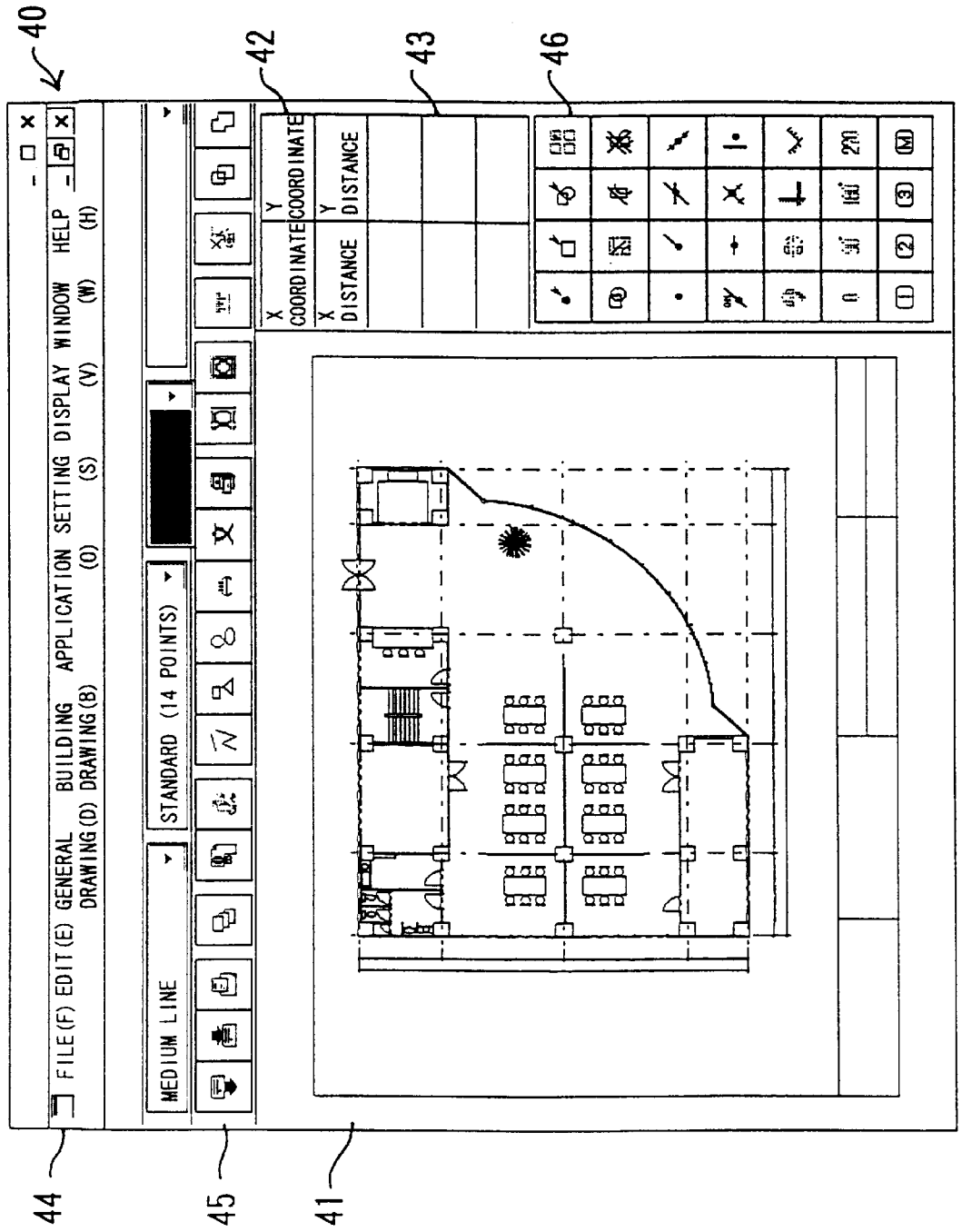
FIG. 5 is a view showing a displayed window of a CAD program.

FIG. 5 shows the displayed window 40 of the CAD program. The window 40 includes a menu bar 44 in its upper portion. When the mouse cursor is moved onto the menu bar 44 and the mouse button is clicked, a pull-down menu is opened. Various functions can be performed when items in the opened pull-down menu are selected. The window 40 also includes a tool bar 45 below the menu bar 44. The tool bar 45 contains icons of those functions which are frequently used on the menu bar 44. Those functions can be executed when the mouse button is clicked on desired icons on the tool bar 45.

The window 40 also includes the drawing display area 41 positioned below a left-hand side of the tool bar 45. In FIG. 5, the drawing display area 41 displays a plan view of the first floor of a building. The window 40 further includes the coordinate field 42, the parameter field 43, and a tool area 46, successively positioned downwardly in the order named, on the right-hand side of the drawing display area 41. The coordinate field 42 is divided into an area for indicating absolute coordinates ("X coordinate" and "Y coordinate") and an area for indicating relative coordinates ("X distance" and "Y distance") from a position where the previous command was executed. The parameter field 43 includes six parameter display areas. The tool area 46 contains various icons for entering auxiliary commands when the command is to be executed.

Figure 6:
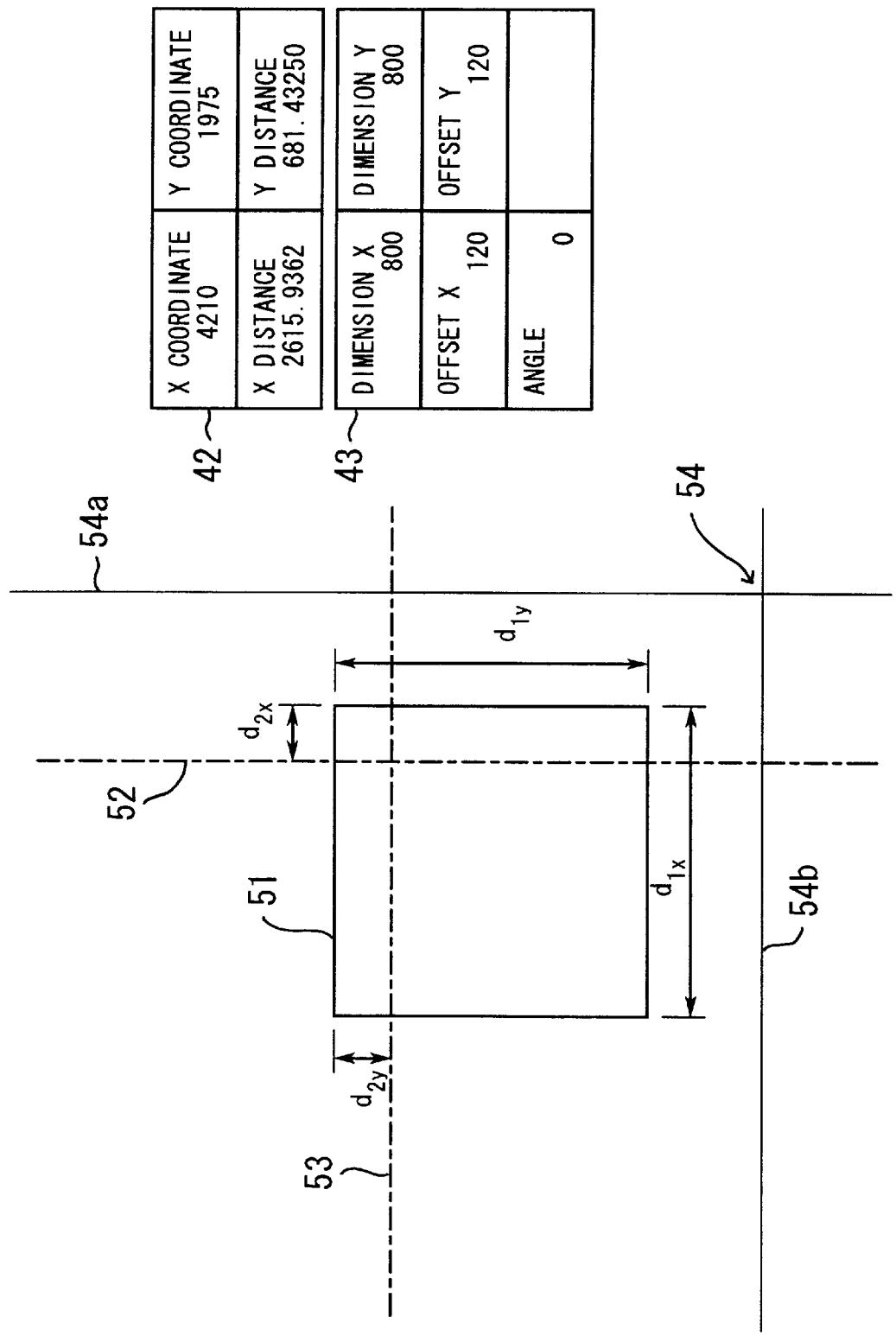
FIG. 6 is a view showing a displayed image for selecting a command for placing a column.

FIG. 6 shows a displayed image for selecting a command for placing a column. In FIG. 6 and also FIGS. 7 through 10, the vertical direction represents a Y axis and the horizontal direction represents an X axis. The user opens the pull-down menu for generating a graphic drawing for a building in the menu bar 44 (shown in FIG. 5), and selects the item of a column in the pull-down menu for thereby selecting a command for establishing a column. The user can similarly select commands for establishing a wall and a fitting. When the command for a column is selected, the drawing display area 41 displays a figure 51 which represents an object for a column. The displayed figure 51 represents a column having a square cross section.

Generally, the position for installing a column is established with respect to reference lines 52, 53. Entries of parameters for establishing the position for installing a column include "DIMENSION X", "DIMENSION Y", "OFFSET X", "OFFSET Y", and "ANGLE". The names and values of these entries are displayed in the parameter field 43. The parameter entries "DIMENSION X" and "DIMENSION Y" represent respective lengths ($d_{1x}$, $d_{1y}$) of the sides of the column in the directions of the X- and Y-axes. The parameter entries "OFFSET X" and "OFFSET Y" represent distances ($d_{2x}$, $d_{2y}$) by which the column projects from the reference lines in the directions of X- and Y-axes. The parameter entry "ANGLE" represents the angle through which the column is to rotate about a reference point.

On the displayed image shown in FIG. 6, a mouse cursor 54 comprises a cross-hair cursor. Specifically, the mouse cursor 54 is positioned at the intersection of vertical and horizontal lines 54a, 54b of the cross-hair cursor. The coordinates of the position of the mouse cursor 54 and relative coordinates thereof with respect to previous coordinate data are displayed in the coordinate field 42.

Figure 7:
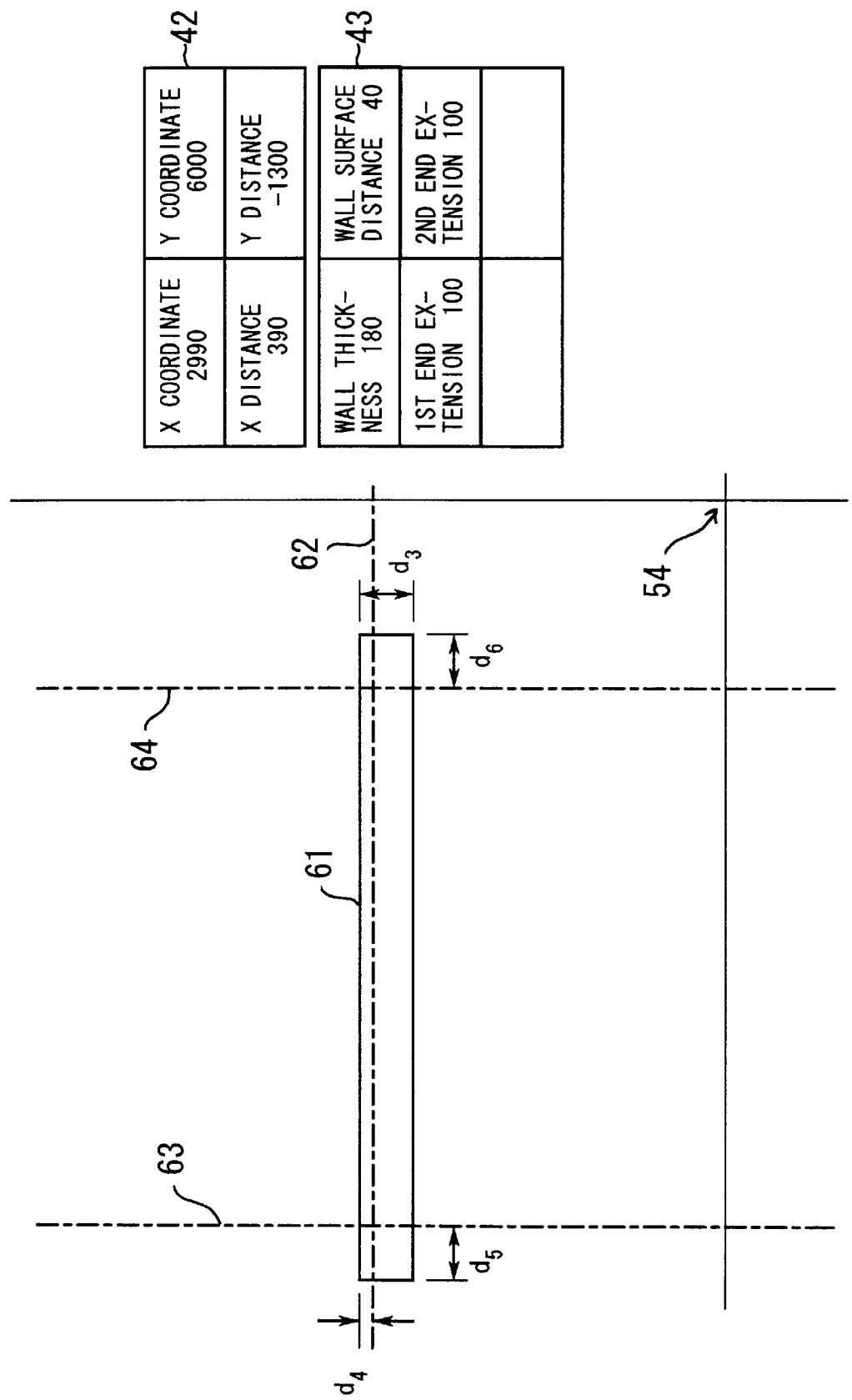
FIG. 7 is a view showing a displayed image for selecting a command for placing a wall.

FIG. 7 shows a displayed image for selecting a command for placing a wall.

When the command for establishing a wall is selected, the drawing display area 41 displays a figure 61 indicative of a wall. Like columns, the position for installing a wall is established with respect to reference lines 62~64. Entries of parameters for establishing the position for installing a wall is include "WALL THICKNESS", "WALL SURFACE DISTANCE", "1ST END EXTENSION", and "2ND END EXTENSION". The names and values of these entries are displayed in the parameter field 43. The parameter entry "WALL THICKNESS" represents a thickness $d_3$ of the wall. The parameter entry "WALL SURFACE DISTANCE" represents a distance $d_4$ by which the wall projects from the reference line 62. The parameter entry "1ST END EXTENSION" represents a distance $d_5$ by which the wall projects from the reference line 63. The parameter entry "2ND END EXTENSION" represents a distance $d_6$ by which the wall projects from the reference line 64.

The position of the cross-hair cursor 54 is displayed in the coordinate field 42.

Figure 8:
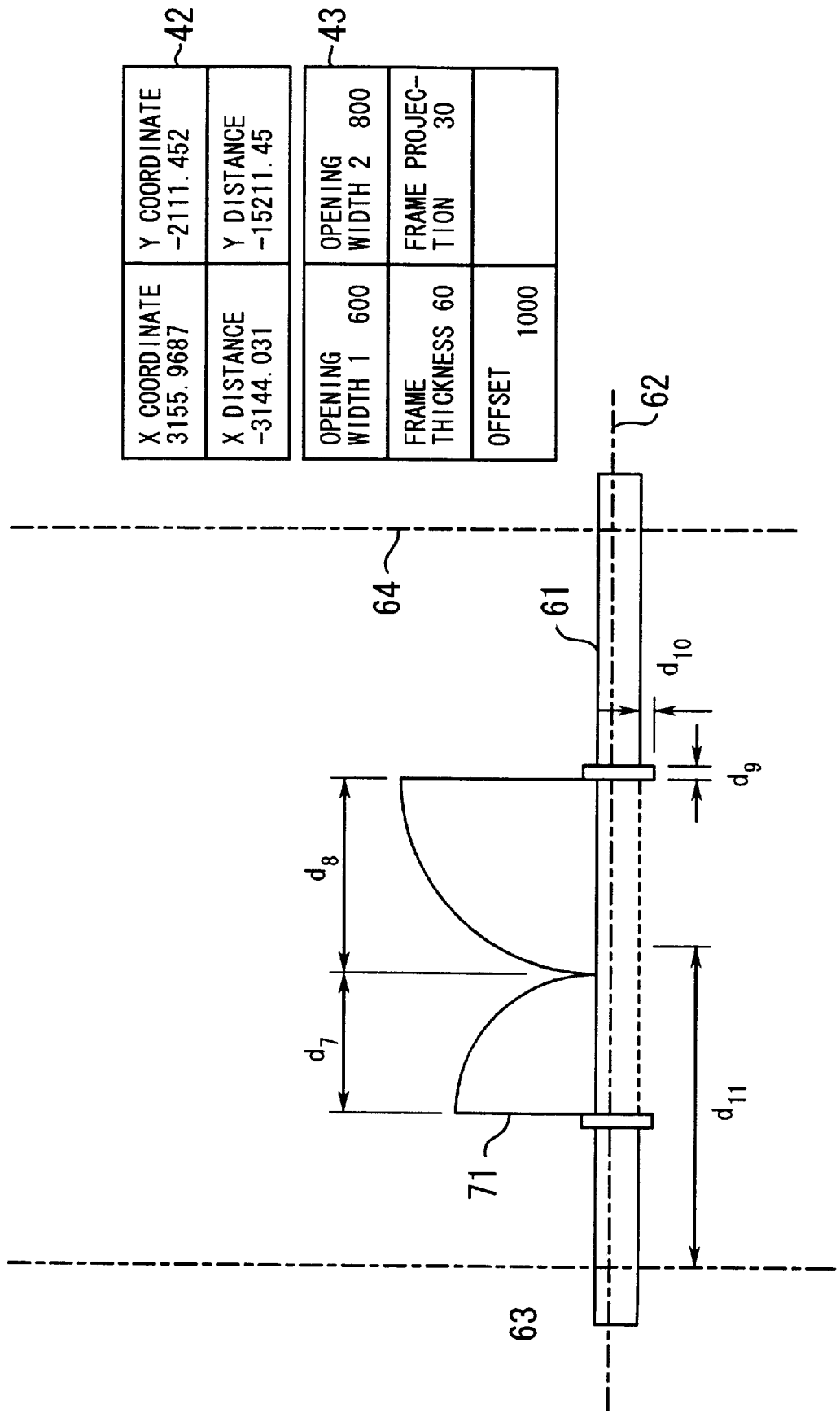
FIG. 8 is a view showing a displayed image for selecting a command for placing a single swinging fitting.

A process of installing a door on the wall shown in FIG. 7 will be described below. FIG. 8 shows a displayed image for selecting a command for placing a single swinging fitting. When the command for placing a single swinging fitting is selected, entries of parameters for establishing single swinging fittings are displayed in the parameter field 43. The names of the parameter entries include "OPENING WIDTH 1", "OPENING WIDTH 2", "FRAME THICKNESS", "FRAME PROJECTION", and "OFFSET". The parameter entry "OPENING WIDTH 1" represents a width $d_7$ of a door panel which can be opened to the left in FIG. 8. The parameter entry "OPENING WIDTH 2" represents a width $d_8$ of a door panel which can be opened to the right in FIG. 8. The parameter entry "FRAME THICKNESS" represents a thickness $d_9$ of the frame of the door. The parameter entry "FRAME PROJECTION" represents a distance $d_{10}$ by which the frame of the door projects from a wall. The parameter entry "OFFSET" represents a distance $d_{11}$ from an offset reference point to an layout reference point.

Figure 9:
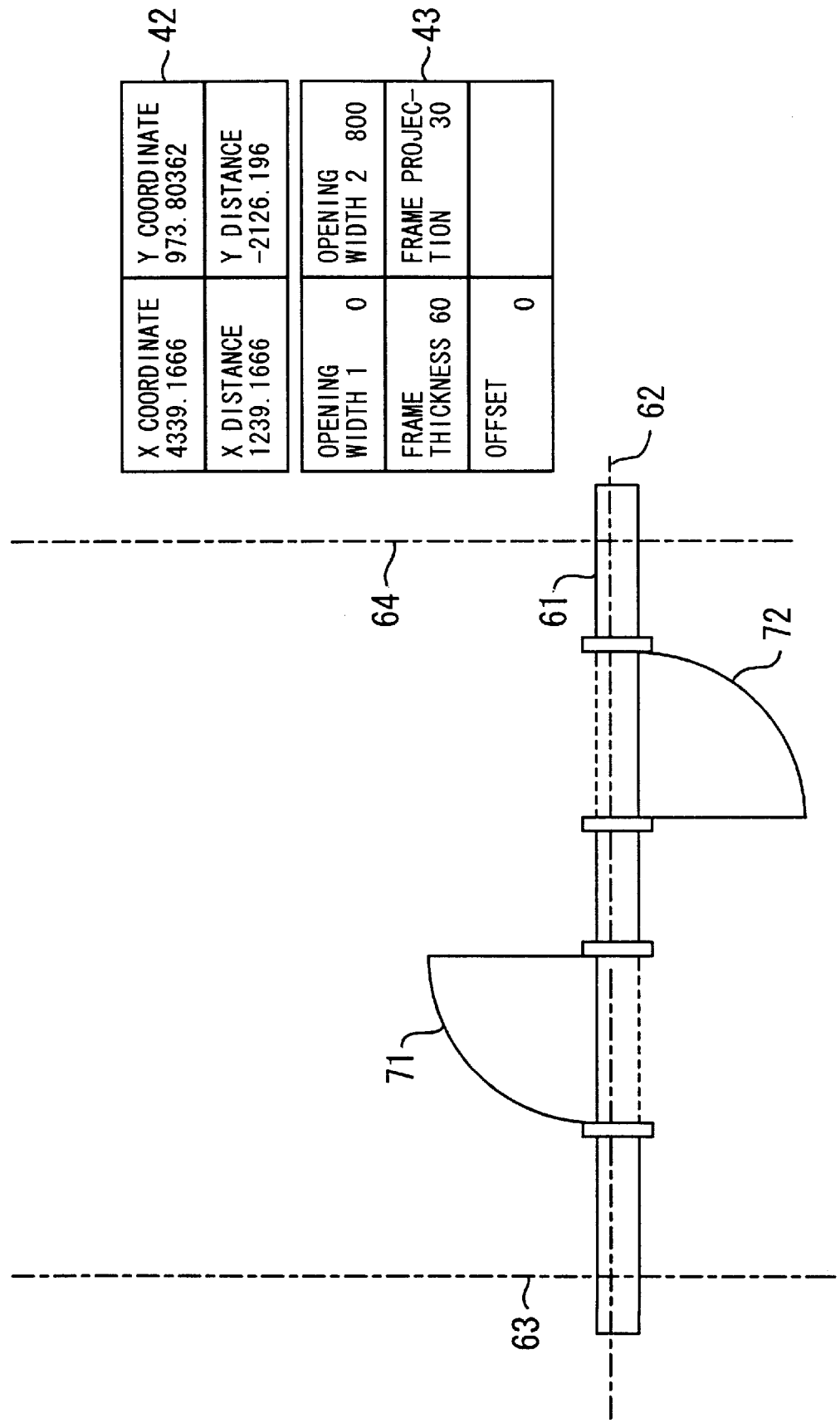
FIG. 9 is a view showing a displayed image after a parameter has changed.

It is assumed that the values of the parameters shown in FIG. 8 are default values and are to be varied. In FIG. 8, the value of the parameter "OPENING WIDTH 1" is "600", and the value of the parameter "OPENING WIDTH 2" is "800". The fitting shown in FIG. 8 is represented by a FIG. 71 which indicate door panels that can be opened to the left and right. If the tab key is pressed at this time, then parameter values can be entered. The value of the parameter "OPENING WIDTH 1" is changed to "0". FIG. 9 shows a displayed image after the parameter "OPENING WIDTH 1" is changed to "0". The fitting FIG. 71 is changed into a figure which indicates a door that can be opened to one side only. When the command for the fitting is executed, the position and shape of the FIG. 71 are determined. The command for the same fitting can be selected to place a FIG. 72 of the same shape as the FIG. 71.

Figure 10:
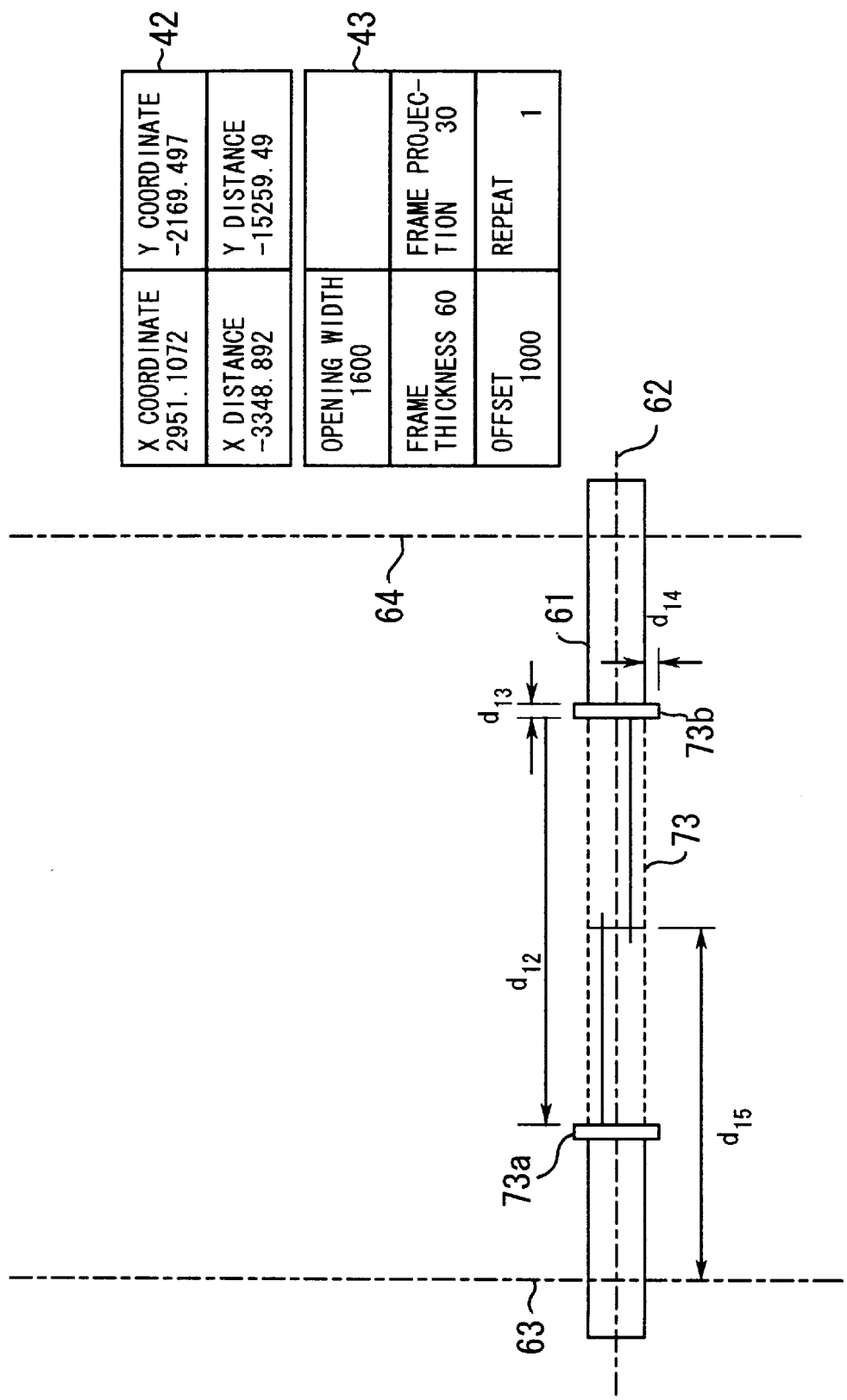
FIG. 10 is a view showing a displayed image for selecting a command for placing a sliding fitting.

FIG. 10 shows a displayed image for selecting a command for placing a sliding fitting. When the command for establishing a sliding fitting is selected, the parameter field 43 displays entries of parameters including "OPENING WIDTH", "FRAME THICKNESS", "FRAME PROJECTION", "OFFSET", and "REPEAT". The parameter entry "OPENING WIDTH" represents a side $d_{12}$ of a door. The parameter entry "FRAME THICKNESS" represents a thickness $d_{13}$ of frame members 73a, 74b. The parameter entry "FRAME PROJECTION" represents a distance $d_{14}$ by which the frame members 73a, 74b project from a surface of a wall 61. The parameter entry "OFFSET" represents a distance $d_{15}$ from an offset reference point to an layout reference point. The parameter entry "REPEAT" represents the number of sliding fittings to be placed in succession. If a plurality of sliding fittings are added, then only one frame is placed between two sliding fittings.

As described above, the entries in the parameter field 43 change depending on the command that has been selected. The user of the CAD system, who generates a graphic drawing, can thus know which parameters should be entered by confirming the displayed parameter entries. When the user changes the value of a parameter by entering a numerical value from the keyboard, the user can easily visually confirm whether the present setting value is appropriate or not because the entered numerical value is displayed in the parameter field 43 and the shape of the figure displayed in the drawing display area 41 also changes depending on the entered parameter value. Since the parameters are grouped together in the parameter field 43, and the coordinates are also grouped together in the coordinate field 42, the user can easily confirm the numerical values of the parameters and the coordinates.

As described above, the process of entering parameters is simplified to easily place figures, and the shape and position of a figure can easily be indicated by controlling the mouse.

Figure 11:
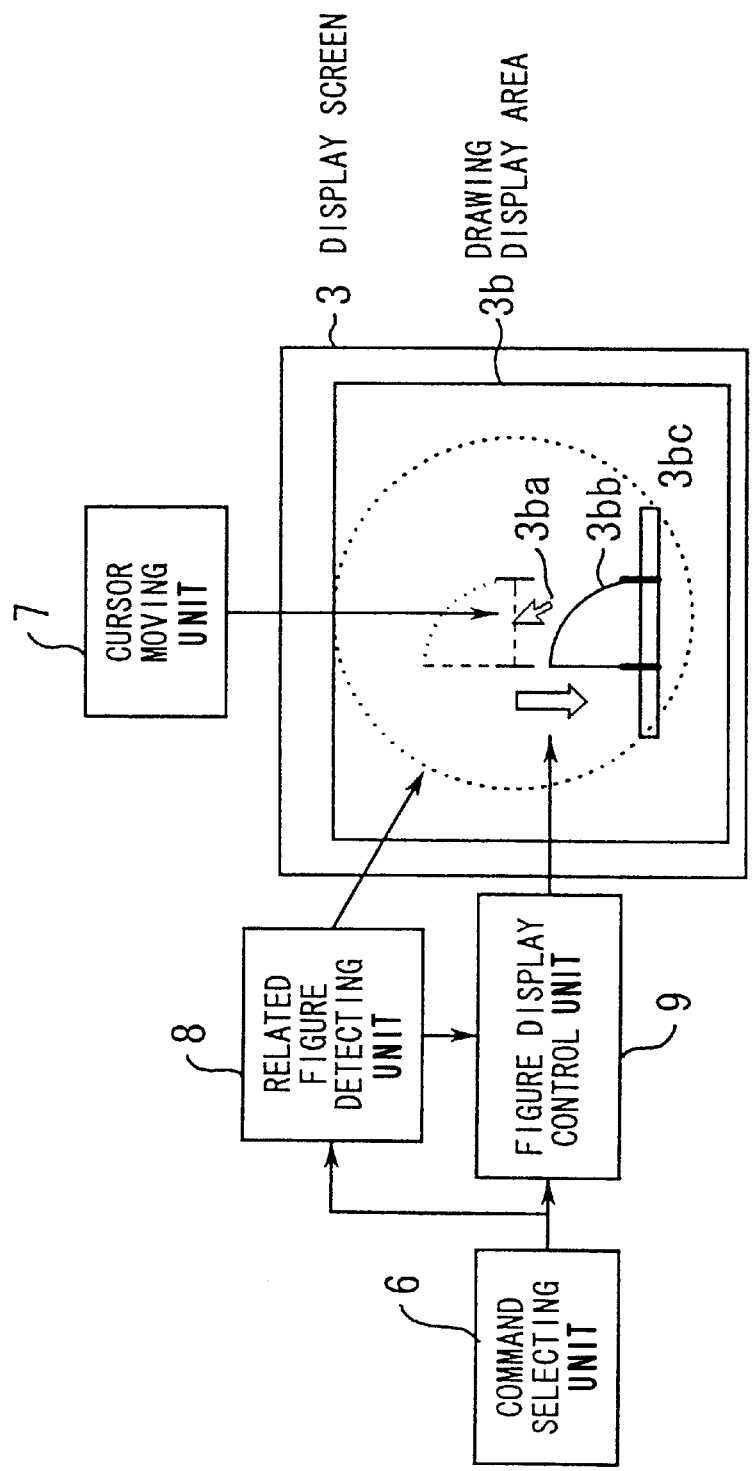
FIG. 11 is a block diagram showing the principles of the present invention for determining the position and shape of an object with the operation of a pointing device.

FIG. 11 shows in block form the principles of the present invention for determining the position and shape of an object with the operation of a pointing device. As shown in FIG. 11, a command selecting unit 6 selects a command for placing a figure 3bb of a desired shape in a desired position. A cursor moving unit 7 moves a cursor 3ba displayed in a drawing display area 3b of a display screen 3. When a command is selected, a related figure detecting unit 8 detects, among determined figures that have already been displayed in the drawing display area 3b, a related figure 3bc which is positioned within a given distance from the cursor 3ba and on which the figure 3bb can be placed in superposed relation. A figure display control unit 9 displays the figure 3bb on the cursor 3ba until the related figure 3bc is detected, and then displays the figure FIG. 3bb on the related figure 3bc when the related figure 3bc is detected.

According to the principles of the present invention shown in FIG. 11, it is possible for the user to place a figure on a desired figure simply by moving the cursor. A specific example of placing a fitting figure with the mouse will be described below.

Figure 12:
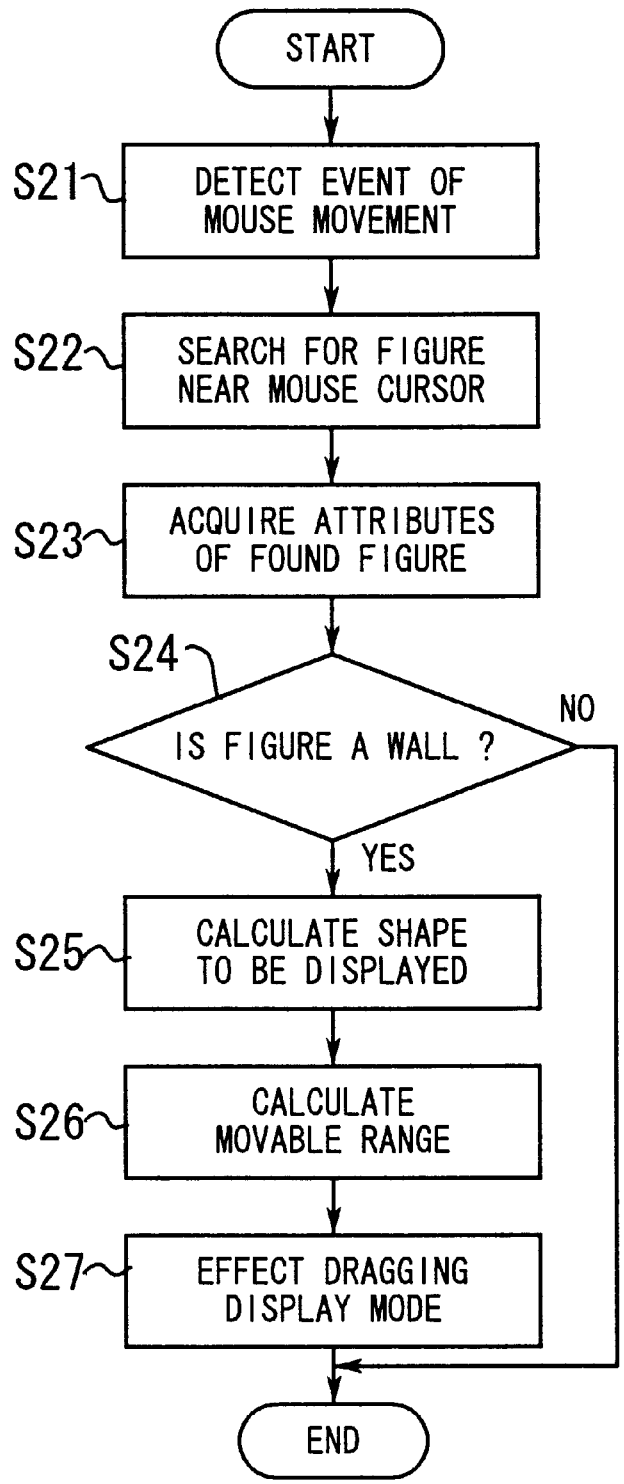
FIG. 12 is a flowchart of a processing sequence for placing a fitting.

FIG. 12 shows a processing sequence for placing a fitting. The processing sequence shown in FIG. 12 is initiated when a command for placing a fitting is selected. The processing sequence is executed by the related figure detecting unit 8 and the figure display control unit 9.

[S21] The related figure detecting unit 8 detects the occurrence of an event for moving the mouse.

[S22] The related figure detecting unit 8 searches for a figure near the mouse cursor.

[S23] The related figure detecting unit 8 acquires the attributes of the figure that has been found. If the figure is a wall, then the related figure detecting unit 8 acquires the thickness and length of the wall. The related figure detecting means 8 also acquires an object type from object data in order to determine the type of the figure.

[S24] The related figure detecting unit 8 decides whether the figure is a wall or not from the acquired object type. If the figure is a wall, then control proceeds to a step S25. If the figure is not a wall, then control comes to an end.

[S25] The related figure detecting unit 8 calculates a shape to be displayed, using the thickness of the wall, in order to cause the thickness of the frame of the fitting to match the thickness of the wall.

[S26] The related figure detecting unit 8 calculates a movable range depending on the length of the wall.

[S27] The figure display control unit 9 effects a dragging display mode by changing the type of representation of the figure which indicates the wall, and moving and displaying the figure of a fitting displayed at the mouse cursor to the figure indicating the wall. For example, the figure display control unit 9 displays the wall in light blue which has been displayed in black, and displays the figure indicating the fitting so as to move on the figure indicating the wall, in response to movement of the mouse cursor.

If any figure is displayed with rubber banding, then the figure display control unit 9 moves the figure which has been displayed at the mouse cursor to the figure that is being displayed with rubber banding.

A figure near the mouse cursor is searched for and whether a figure can be superposed or not is determined based on the object data. Each figure is displayed as a visible figure converted from the object data. Therefore, information of an object can be obtained by checking the object data.

Figure 13:
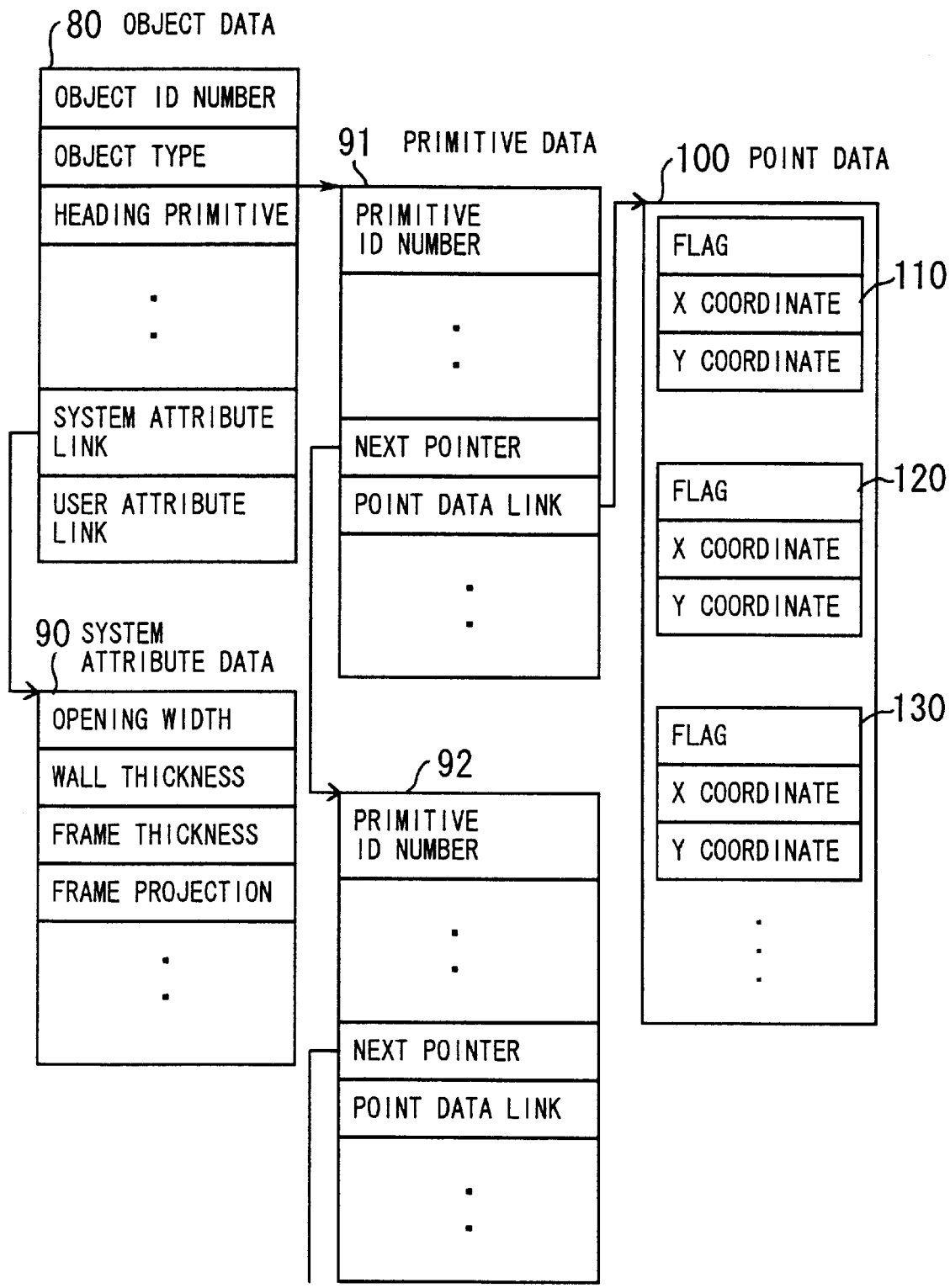
FIG. 13 is a diagram showing the structure of data generated when a fitting is generated.

FIG. 13 shows the structure of data generated when a fitting, i.e., a sliding fitting, is generated. In FIG. 13, object data 80 includes data relative to an object identification number, an object type, a heading primitive, a system attribute link, and a user attribute link. The object identification number is an inherent number for identifying the object. The object type is a code for indicating that the object is a fitting. The heading primitive is indicative of the position of heading primitive data 91. The system attribute link indicates link information representing a link to system attribute data 90 for indicating attributes of the object. The user attribute link indicates link information representing a link to attributes of a user when system settings vary from user to user.

The system attribute data 90 indicate types of parameters required to determine the position and shape of each object. System attribute data for a sliding fitting include data relative to an opening width, a wall thickness, a frame thickness, and a frame projection.

Primitive data 91, 92 are data with respect to lines, etc. as a basis for displaying the figure of an object on the display screen. Therefore, a figure representing an object such as a fitting or the like is indicated by a collection of plural primitive data. The primitive data 91, 92 contain data relative to a primitive identification number, a NEXT pointer, a point data link, etc. The primitive identification number is an inherent number for indicating the primitive data 91, 92. The NEXT pointer is indicative of the position of next primitive data. The point data link indicates link information representing a link to point data.

Point data 100 include positional information 110, 120, 130 basically required to draw a figure based on the primitive data 91. Each of the positional information 110, 120, 130 contains a flag, an X coordinate, and a Y coordinate. The flag indicates whether the coordinates indicated by each of the positional information 110, 120, 130 is effective or not.

When the related figure detecting unit 8 detects a figure near the mouse cursor, it acquires data of the detected figure, decides whether the detected figure is a wall or not based on the object type of the acquired data, and determines the position, etc. of the figure from point data. In this manner, it is possible to detect a figure on which a figure to be operated can be superposed.

Figure 14A:
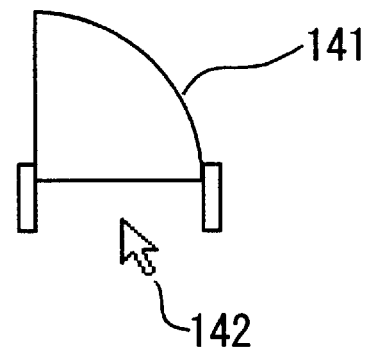
FIGS. 14(A) and 14(B) are views showing how a figure changes when a fitting is moved closer to a wall, FIG. 14(A) showing a state in which the fitting is sufficiently spaced from the wall, and FIG. 14(B) showing a state in which the fitting and the wall are positioned closely to each other.
Figure 14B:
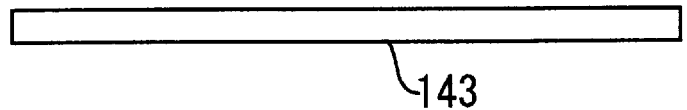
Figure 14B:
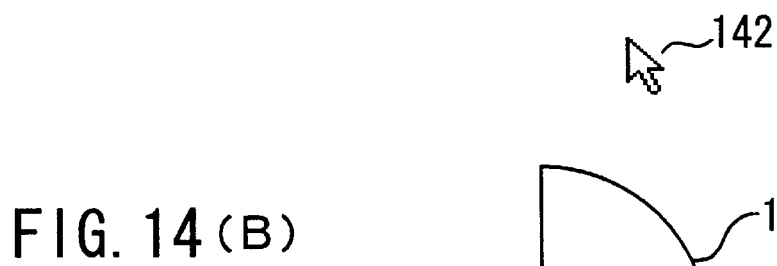

FIGS. 14(A) and 14(B) show how a figure changes when a fitting is moved closer to a wall. In FIG. 14(A), a fitting 141 and a wall 143 are sufficiently spaced from each other. The wall 143 is shown by black lines. The fitting 141 is displayed at the position of a mouse cursor 142. When the mouse cursor 142 is then moved, the fitting 141 is moved closely to the wall 143.

In FIG. 14(B), the fitting 141 and the wall 143 are positioned closely to each other. The wall 143 is indicated by the dotted lines. Actually, however, the wall 143 is displayed by changing its color to a loud color. The fitting 141 is displayed on the wall 143 so as to be spaced from the mouse cursor 142. The position of the fitting 141 is at a point of intersection between the wall 143 and a line extending downwardly from the mouse cursor 142 perpendicularly to the mouse cursor 142, but is not spaced off the wall 143. The fitting 141 is thus displayed on the wall 143 at a position closest to the mouse cursor 142. The thickness of the frame of the fitting 141 is calculated from the thickness of the wall 143.

When the fitting 141 is moved closely to the wall 143, therefore, the fitting 141 is moved onto the wall 143. When the mouse cursor 142 is moved parallel to the wall 143, the fitting 141 is also moved on the wall 143 in response to the movement of the mouse cursor 142. When a left-hand button on the mouse is clicked, the values of the parameters are converted into values at the position of the fitting 141, determining a layout reference position for the fitting 141. If the left-hand button on the mouse is not clicked, but an escape key is pressed, then the fitting 141 can be freed from the wall 143.

The layout reference position is a reference position for placing the figure. When the layout reference position is corrected based on the values of the parameters, a final layout position is determined.

After the layout reference position for placing the fitting is determined, the position and shape of the figure are determined. Specifically, the position and shape of the figure are finally determined when the mouse cursor is moved while the button on the mouse, which has been pressed to determine the layout reference position, is being continuously pressed.

Figure 15:
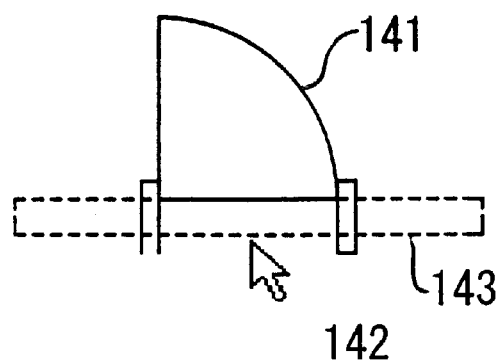
FIGS. 15(A) through 15(E) are views showing a process of selecting the position and shape of the fitting.
Figure 15:
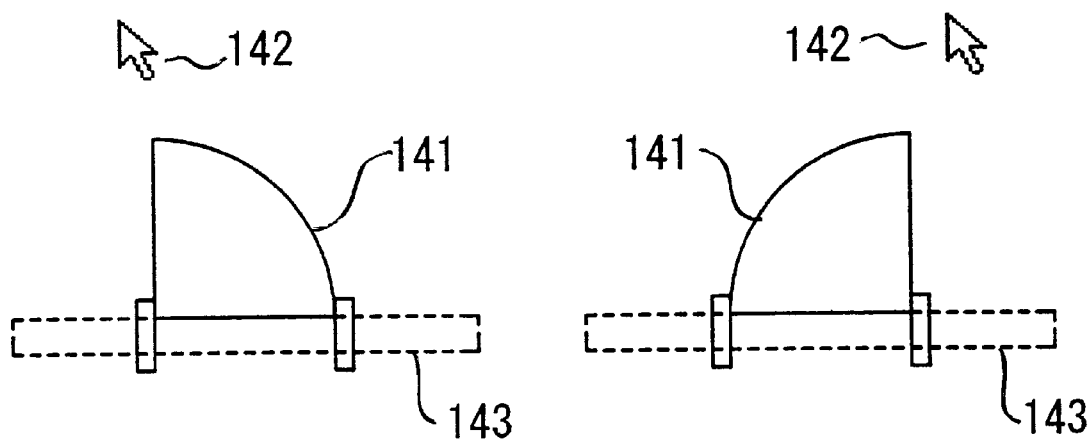
Figure 15:
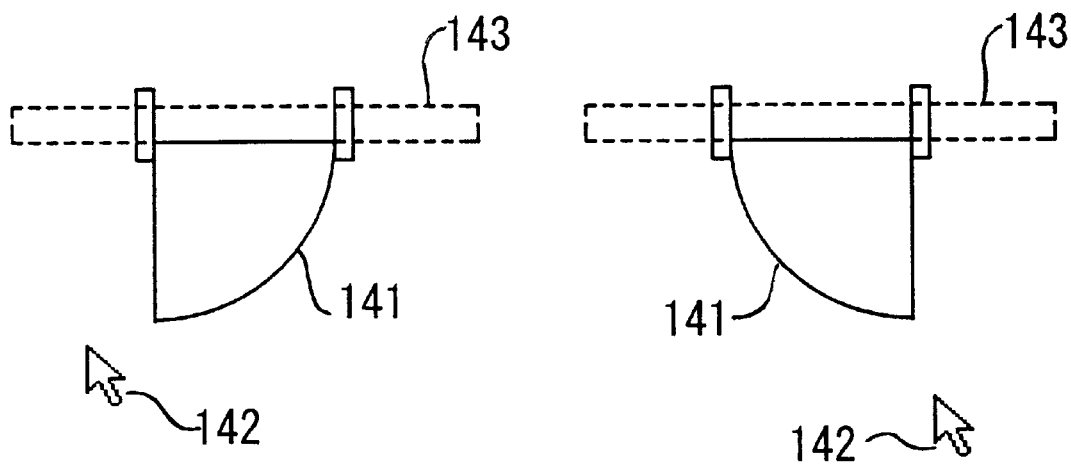

FIGS. 15(A) through 15(E) show a process of selecting the position and shape of the fitting. FIG. 15(A) illustrates the fitting whose position has been determined. It is assumed in this example that the button on the mouse is clicked after the mouse cursor 142 is moved onto the wall 143. While the button on the mouse is being continuously pressed, the mouse cursor 142 is moved.

FIG. 15(B) illustrates the mouse cursor 142 which has been moved to an upper left position. In this position, the door of the fitting 141 is opened upwardly to the left. FIG. 15(C) illustrates the mouse cursor 142 which has been moved to an upper right position. In this position, the door of the fitting 141 is opened upwardly to the right. FIG. 15(D) illustrates the mouse cursor 142 which has been moved to a lower left position. In this position, the door of the fitting 141 is opened downwardly to the left. FIG. 15(E) illustrates the mouse cursor 142 which has been moved to a lower right position. In this position, the door of the fitting 141 is opened downwardly to the right.

The user can therefore change the fitting 141 in shape simply by moving the mouse. When the user releases the button on the mouse at the time the fitting 141 assumes a desired shape, the position and shape of the fitting 141 are determined.

In the above example, the fitting is placed on the wall and hence the direction in which the door of the fitting changes depending on the position of the mouse cursor. However, similar operations may be carried out for placing another figure. Specifically, some parameters that are established for placing a figure do not allow the position and shape of the figure to be determined unless a direction is specified. The direction can be indicated by moving the mouse cursor. For example, for placing a wall for which the parameter "WALL SURFACE DISTANCE" has been established, the direction in which the wall should be moved can be changed depending on the position of the mouse cursor. When an indicated direction for a directional parameter such as the parameter "WALL SURFACE DISTANCE" is determined, the final position of the figure is determined.

According to the present invention, as described above, when a command is selected, parameters required for the execution of the command are displayed on the display screen, and when values are entered for the displayed parameters, the command is executed according to the entered values. Therefore, the user who generates a graphic drawing is not required to memorize parameters used to execute the selected command, and can easily select necessary parameters and change their values.

For displaying a figure of a selected command, if a related figure that can be superposed on the figure is positioned near the cursor, then the figure displayed at the cursor can be moved onto the related figure and moved in a range on the related figure. Therefore, the user can easily select a position where the figure is to be placed.

If a layout reference position for a figure is determined and an indicated direction for various directional parameters is not determined, then the indicated direction can be changed and at the same time the shape or position of the figure can be changed depending on the position of the cursor. Consequently, the user can easily determined the position and shape of the figure by moving the cursor.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A CAD system for generating a graphic drawing by placing a figure on a display screen of a display device, comprising:

command selecting means for selecting a command to place a figure of a desired shape in a desired position;

parameter managing means for holding parameters used to execute the command which is selected;

displaying means for displaying both of the figure specified by the command and the parameters being managed by the parameter managing means on a single display screen of the display device, said single display having a drawing display area where the specified figure is drawn and a parameter field where names and values of the parameters associated with the figure are listed;

parameter entering means for entering given values for the parameters which are held by said parameter managing means and listed in the parameter field; and command executing means, coupled to said parameter managing means, for determining the position and shape of the figure using the values of the parameters to execute the command so that the values of the parameters entered by said parameter entering means will be immediately reflected to the figure being displayed in the drawing display area.

2. A CAD system according to claim 1, further comprising:

coordinate managing means for holding coordinates as a reference to place the figure and displaying the coordinates on the display screen; and coordinate entering means for entering given values for the coordinates held by said coordinate managing means;

wherein:

the parameters associated with the figure include an offset value which defines a relative position of the figure to the references; and said command executing means determines the position of the figure from the coordinates of the reference and the offset value defined as part the parameters.

3. A CAD system for generating a graphic drawing by placing figures on a display screen, comprising:

command selecting means for selecting a command to place a figure of a desired shape in a desired position;

cursor moving means for moving a cursor on the display screen, thereby updating a cursor position;

related figure detecting means for detecting, among figures that have already been laid out and displayed on the display screen, a related figure which is found within a given distance from the cursor and whose attributes indicate that the figure specified by the command can be placed at a predefined particular position relative to said related figure; and figure display control means for dragging the figure by displaying the figure at the updated cursor position until the related figure is detected by said related figure detecting means and positioning the figure at the predefined particular position relative to the related figure when the related figure is detected.

4. The CAD system according to claim 3, further comprising:

parameter managing means for holding parameters which defines the shape of the figure specified by the command, as well as parameters of the figures that have already been laid out; and parameter modifying means for modifying the parameters of the figure according to relevant parameters of the related figure, to change the shape of the figure so that the figure, when placed, will harmonize with the related figure detected by said related figure detecting means.

5. A CAD system for generating a graphic drawing by placing a figure on a display screen, comprising:

command selecting means for selecting a command to place a figure of a desired shape in a desired position;

layout position determining means for determining a layout reference position for the figure when the command is selected by said command selecting means and the figure is provisionally positioned;

cursor moving means for moving a cursor on the display screen; and figure shape control means for varying the position or shape of the figure whose layout reference position has been determined, according to a relative position of the cursor with respect to the layout reference position, and finalizing the position and shape of the figure at the time an instruction to execute the command is outputted.

* * * * *